US012777624B2

(12) United States Patent
Park et al.

(10) Patent No.: US 12,777,624 B2
(45) Date of Patent: Oct. 27, 2026

(54) POWER SUPPLY PANEL, POWER SUPPLY STRUCTURE AND FACILITY FOR TRANSPORTING SUBSTRATE

(71) Applicant: SEMES CO., LTD., Chungcheongnam-do (KR)

(72) Inventors: Jae Bong Park, Chungcheongnam-do (KR); Ki Sub Yoon, Chungcheongnam-do (KR); Jeong Seok Lee, Chungcheongnam-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 440 days.

(21) Appl. No.: 18/130,422

(22) Filed: Apr. 3, 2023

(65) Prior Publication Data

US 2024/0023292 A1 Jan. 18, 2024

(30) Foreign Application Priority Data

Jul. 15, 2022 (KR) ........................ 10-2022-0087397

(51) Int. Cl.

| | |
|---|---|
| ***B66C 13/00*** | (2006.01) |
| ***B66C 13/12*** | (2006.01) |
| ***H05K 7/20*** | (2006.01) |
| ***H10P 72/30*** | (2026.01) |
| *B66C 19/00* | (2006.01) |

(52) U.S. Cl.

CPC ......... *H05K 7/20909* (2013.01); *B66C 13/12* (2013.01); *H05K 7/20145* (2013.01); *H10P 72/3221* (2026.01); *B66C 19/00* (2013.01)

(58) Field of Classification Search

CPC ............. H05K 7/20909; H05K 5/0247; H05K 5/0217; H05K 7/02; H05K 7/20136; H05K 7/14322; B66C 13/12; B66C 19/00; H02B 1/56; H02B 1/30; H02B 1/44; H02B 1/54; H02B 1/28; H02B 1/48; H02B 1/20; H02B 1/04; H10P 72/3221

See application file for complete search history.

(56) References Cited

U.S. PATENT DOCUMENTS

| | | | | |
|---|---|---|---|---|
| 9,502,275 | B1 | 11/2016 | Trussell et al. | |
| 2023/0409042 | A1* | 12/2023 | Kim | B65G 43/00 |
| 2024/0128109 | A1* | 4/2024 | Kim | H10P 72/0606 |

(Continued)

FOREIGN PATENT DOCUMENTS

| | | | |
|---|---|---|---|
| JP | 2004173721 A | * | 6/2004 |
| KR | 10-0919499 | | 9/2009 |

(Continued)

OTHER PUBLICATIONS

English translation JP 2004173721 (Year: 2004).*

(Continued)

*Primary Examiner* — Mandeep S Buttar

(74) *Attorney, Agent, or Firm* — WOMBLE BOND DICKINSON (US) LLP

(57) ABSTRACT

A power supply panel according to the present disclosure is buried in a buried space having a groove structure or a hole structure, formed in a wall of a fabrication facility (FAB), such that a front portion is disposed on an exposed surface of the buried space, and includes a power supply body supplying power; and a heat dissipation portion formed in the front portion of the power supply body.

15 Claims, 12 Drawing Sheets

(56) References Cited

U.S. PATENT DOCUMENTS

| | | | | |
|---|---|---|---|---|
| 2024/0253900 | A1* | 8/2024 | Lee | B65G 1/0464 |
| 2025/0136374 | A1* | 5/2025 | Jeong | B65G 1/0464 |
| 2025/0266276 | A1* | 8/2025 | Fujiwara | H10P 72/0612 |

FOREIGN PATENT DOCUMENTS

| | | | | |
|---|---|---|---|---|
| KR | 10-2011-0001776 | | 1/2011 | |
| KR | 20110137904 A | * | 12/2011 | A47B 96/06 |
| KR | 10-2017-0054241 | | 5/2017 | |
| KR | 10-2017-0143000 | | 12/2017 | |
| KR | 10-1879587 | | 7/2018 | |
| KR | 10-2021-0153835 | | 12/2021 | |
| WO | 2011/060418 | | 5/2011 | |

OTHER PUBLICATIONS

English translation KR 20110137904 (Year: 2011).*

Office Action dated Dec. 29, 2023 for Korean Patent Application No. 10-2022-0087397 and its English translation by Google Translate.

* cited by examiner

POWER SUPPLY PANEL, POWER SUPPLY STRUCTURE AND FACILITY FOR TRANSPORTING SUBSTRATE

CROSS-REFERENCE TO RELATED APPLICATION(S)

This application claims benefit of priority to Korean Patent Application No. 10-2022-0087397 filed on Jul. 15, 2022 in the Korean Intellectual Property Office, the disclosure of which is incorporated herein by reference in its entirety.

BACKGROUND

1. Field

The present disclosure relates to a power supply panel, a power supply structure, and a facility for transporting a substrate.

2. Description of Related Art

A semiconductor (or display) manufacturing process may be a process for manufacturing a semiconductor device on a substrate (e.g., a wafer), and may include, for example, exposure, deposition, etching, ion implantation, cleaning, packaging, and the like. As a factory for manufacturing semiconductor devices, a fabrication facility (FAB) may include a plurality of stories, and facilities for performing semiconductor manufacturing processes may be disposed on each of the stories.

In order to maximize efficiency of a semiconductor manufacturing process, a method for improving each semiconductor manufacturing process as well as a technique for quickly and efficiently transporting an article (e.g., a substrate) between manufacturing facilities has been introduced. Representatively, an overhead hoist transport (OHT) system for transporting the article along a path installed on a ceiling of a semiconductor manufacturing space in the FAB is being applied. In general, the OHT system may include a rail installed on the ceiling, and a ceiling transport vehicle installed on the rail. The ceiling transport vehicle may transport a substrate contained in a front opening unified pod (FOUP) to a manufacturing facility for each production process while traveling along the rail. In addition, when it is necessary to store the article during transportation between semiconductor manufacturing facilities, a storage system for storing the article may be provided.

Meanwhile, the ceiling transport vehicle may use electrical energy as a power source. To this end, an electric cable may be disposed along the rail to supply the electrical energy to the ceiling transport vehicle. The electric cable may transfer the electrical energy to the ceiling transport vehicle in a non-contact power supply method, and such a non-contact power supply system may be referred to as high-efficiency inductive power distribution (HID) or contactless power supply (CPS).

As a power supply panel for supplying power in such a non-contact power supply system is simply disposed in a structure that is not buried in a sub-FAB of the FAB, space utilization efficiency may be reduced and electric cables may be complicatedly arranged.

(Prior Art Document 1) Republic of Korea Patent Registration No. 10-0919499

SUMMARY

The present disclosure has been devised to solve the above limitations, and an object thereof is to provide a power supply panel, a power supply structure, and a facility for transporting a substrate, improving space utilization efficiency and facilitating maintenance of electric cables.

In order to achieve the above object, a power supply panel according to the present disclosure includes a power supply body supplying power; and a heat dissipation portion including an inlet through which air is suctioned into the power supply body by a heat dissipation fan installed in the power supply body, and an outlet through which air is discharged from the power supply body externally by the heat dissipation fan, wherein the inlet and the outlet are formed in a front portion of the power supply body.

The power supply body may be buried in a buried space having a groove structure or a hole structure, formed in a wall of a fabrication facility (FAB), such that the front portion is disposed on an exposed surface of the buried space, and the inlet may be formed in a lower portion of the front portion of the power supply body, and the outlet may be formed in an upper portion of the front portion of the power supply body.

The present disclosure may further include a cable connection portion formed on the power supply body and to which an electric cable to which the power is applied is connected, wherein the cable connection portion may be formed independently on an upper surface portion and a lower surface portion of the power supply body, respectively.

The present disclosure may further include a main anchor fixing the power supply body to a bottom surface facing the power supply body in the buried space, wherein the main anchor may include a connection portion installed laterally on a lower surface of the power supply body and extending in a downward direction; and a fixing portion extending from the connection portion toward a center of the lower surface of the power supply body so as not to protrude from the power supply body in a lateral direction, and supported by and fixed to the bottom surface facing the power supply body.

The present disclosure may further include an upper anchor fixing an upper portion of the power supply body to a rear wall surface facing the power supply body in the buried space, wherein the upper anchor may be rear installed on the upper surface of the power supply body, may extend in an upward direction, and may be supported by and fixed to the rear wall surface facing the power supply body.

The present disclosure may further include a rear anchor fixing a rear portion of the power supply body to a portion of the bottom surface facing the rear portion of the power supply body in the buried space, wherein the rear anchor may be installed on a lower portion of a rear surface of the power supply body, may extend in a downward direction, and may be supported by and fixed to the portion of the bottom surface facing the rear portion of the power supply body.

According to another aspect of the present disclosure, a power supply structure includes a buried space having a groove structure or a hole structure, formed in a fabrication facility (FAB); a power supply body buried in the buried space such that a front portion is disposed on an exposed surface of the buried space, and supplying power; and a heat dissipation portion formed on the front side of the power supply body.

The buried space may be formed in a wall of the FAB to be exposed to a semiconductor manufacturing space of the FAB.

In the FAB, a duct chamber in which an air duct is disposed may be formed outside the wall, wherein the buried space may be formed to be exposed to the duct chamber or to both a semiconductor manufacturing space and the duct chamber in the FAB.

The FAB may include a main FAB and a sub-FAB below the main FAB, and as an example, the buried space may be formed in a wall of the main FAB. As another example, the buried space may be formed in a ceiling of the main FAB. As another example, the buried space may be formed as a slab between the main FAB and the sub-FAB.

According to another aspect of the present disclosure, a facility for transporting a substrate includes an overhead hoist transport (OHT) vehicle moving along a rail installed on a ceiling in a fabrication facility (FAB); an electric cable installed on the rail; a power supply body buried in a buried space having a groove structure or a hole structure, formed in a wall of the FAB, such that a front portion is disposed on an exposed surface of the buried space, and the electric cable is connected to the OHT vehicle and supplies power to the OHT vehicle through the electric cable; and a heat dissipation portion formed in the front portion of the power supply body, to be exposed in a direction, other than a direction facing the buried space.

The buried space may be formed to face an exposed surface of a semiconductor manufacturing space in the FAB, and the front portion of the power supply body in which the heat dissipation portion is formed may be disposed to face the semiconductor manufacturing space.

The FAB may have a duct chamber in which an air duct is disposed outside the wall, and the buried space may be formed to be exposed to the duct chamber or to both a semiconductor manufacturing space and the duct chamber in the FAB.

The front portion of the power supply body in which the heat dissipation portion is formed may be disposed to face the duct chamber, and the electric cable may be disposed from the power supply body to face the semiconductor manufacturing space through the duct chamber.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
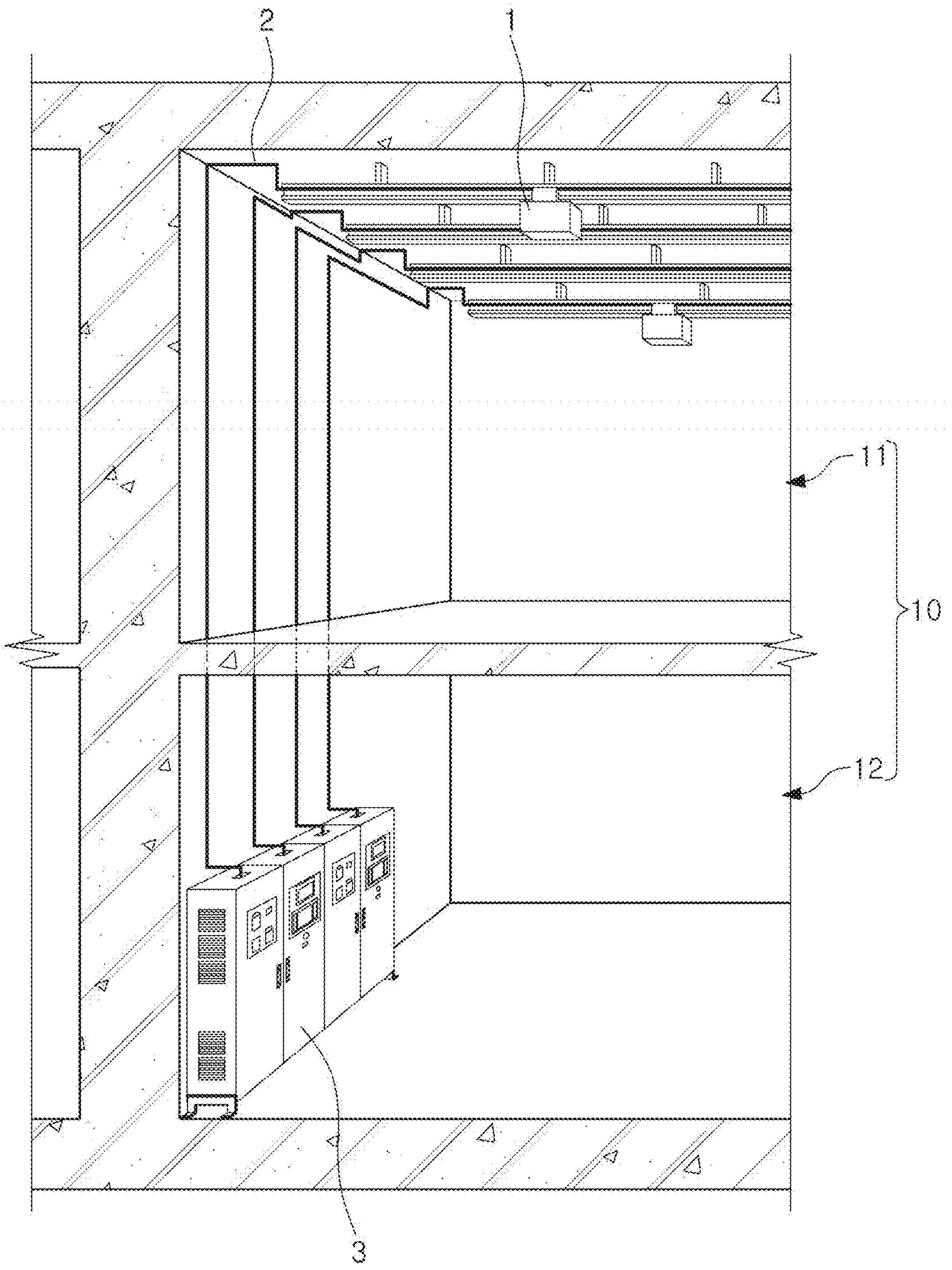
FIG. 1 is a view illustrating that a power supply panel according to the prior art is disposed in a sub-FAB.

Hereinafter, preferred embodiments will be described in detail such that those skilled in the art may easily practice the present disclosure with reference to the accompanying drawings. However, in describing a preferred embodiment of the present disclosure in detail, if it may be determined that a detailed description of a related known function or configuration unnecessarily obscure the gist of the present disclosure, the detailed description will be omitted. In addition, the same reference numerals may be used throughout the drawings for a portion having a similar function and action. In addition, in this specification, terms such as 'on,' 'upper,' 'upper portion,' 'upper surface,' 'below,' 'lower,' 'lower portion,' 'lower surface', and 'side surface' may be based on the drawings, and may be actually vary depending on a direction in which an element or a component is placed.

In addition, throughout the specification, when a portion is said to be 'connected' to another portion, this may include not only a case in which it is 'directly connected,' but also a case in which it is 'indirectly connected' with another element in between. In addition, 'including' a certain component means that other components may be further included, rather than excluding other components, unless otherwise stated.

Figure 2:
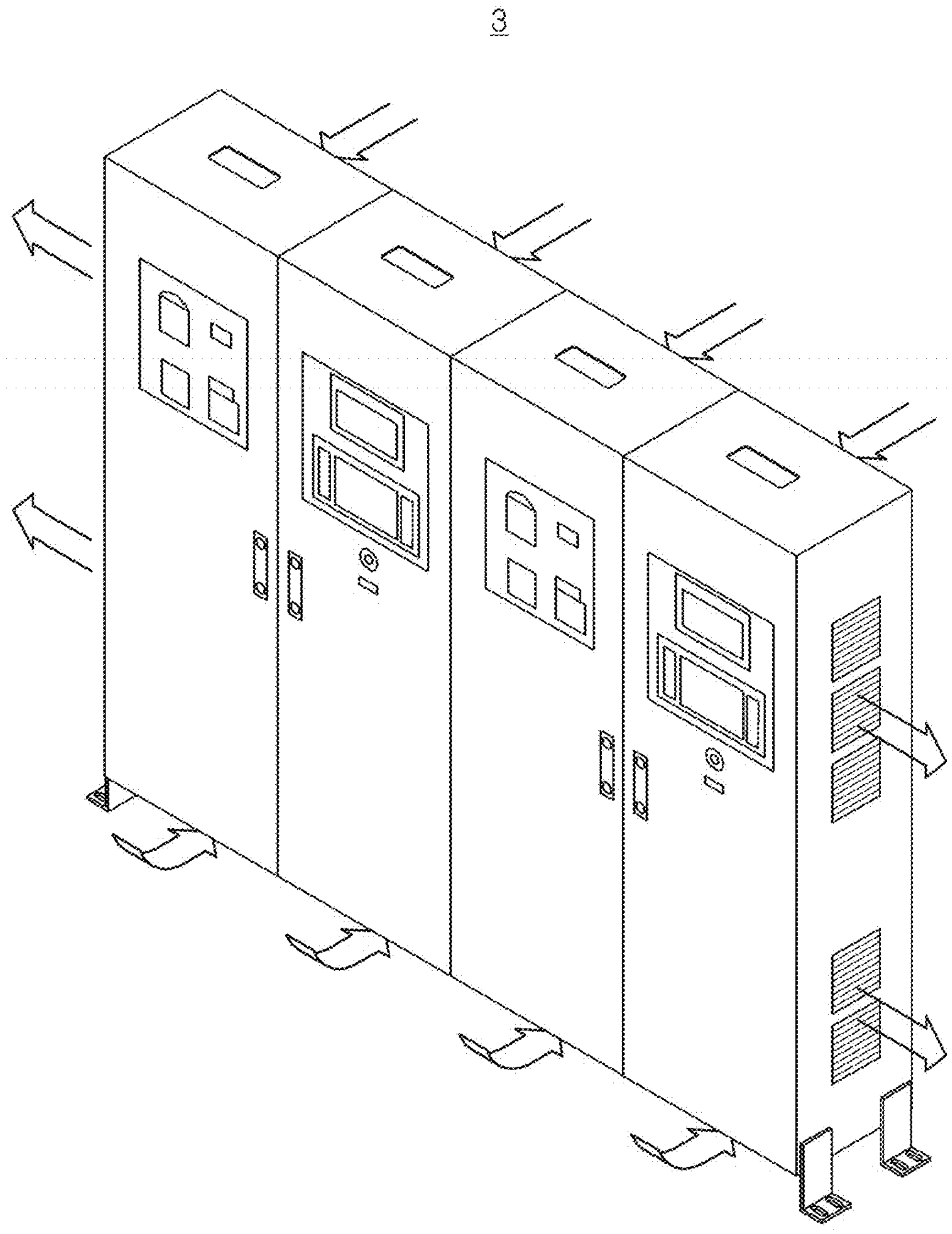
FIG. 2 is a view illustrating that air is suctioned and discharged through a heat dissipation portion in the power supply panel of FIG. 1.

FIG. 1 is a view illustrating that a power supply panel according to the prior art is disposed in a sub-FAB, and FIG. 2 is a view illustrating that air is suctioned and discharged through a heat dissipation portion in the power supply panel of FIG. 1.

A clean room may be provided in which a clean state or a super clean state is required, such as a semiconductor FAB, a display FAB, a pharmaceutical manufacturing factory, a food manufacturing factory, or the like. For example, a fabrication facility (FAB) for manufacturing a semiconductor may be divided into a main FAB and a lower sub-FAB, and a concrete slab may be formed between the main FAB and the sub-FAB. The main FAB may form a clean room, and semiconductor manufacturing equipment used in each semiconductor manufacturing process may be installed therein. Electrical wiring for supplying power to semiconductor manufacturing equipment of the main FAB may be installed in an upper region of the sub-FAB, and a power supply panel for supplying the power may be installed in a lower region of the sub-FAB.

Referring to the drawings, in a main FAB 11 disposed in an upper portion of a FAB 10, an overhead hoist transport (OHT) vehicle (a ceiling transport vehicle) 1 for transporting a FOUP containing a substrate may be disposed on a ceiling.

The OHT vehicle 1 may receive power from a power supply panel 3 through an electric cable 2, and may move. In this case, high-efficiency inductive power distribution (HID) refers to a non-contact power supply system.

Hundreds of power supply panels 3 may be required to supply power to many semiconductor manufacturing facilities in the FAB 10. Since a space is insufficient to place the hundreds of power supply panels 3 on the main FAB 11 filled with the semiconductor manufacturing facilities, the hundreds of power supply panels 3 may be placed on a sub-FAB 12 rather than the main FAB 11.

The power supply panel 3 may be simply disposed adjacent to a wall in a facility arrangement region as an arrangement structure not buried in the sub-FAB 12. The hundreds of power supply panels 3 having such an arrangement structure may have a limitation of reducing space utilization efficiency of the facility arrangement region in the sub-FAB 12.

In addition, the power supply panel 3 may be disposed in the sub-FAB 12 disposed below the main FAB 11, rather than the main FAB 11, in the FAB 10. As a result, the electric cable 2 should be linearly installed from the sub-FAB 12 to the main FAB 11. Since an enormous number of electric cables 2 leading from the hundreds of power supply panels 3 may be long and complicatedly installed over the two stories, there may be many limitations in terms of maintenance in occurrence of future problems.

To overcome the above-described limitations, according to the present disclosure, the power supply panel may be disposed in a buried type in the FAB, and may be further installed on the main FAB rather than the sub-FAB. Details thereof will be as follows.

Figure 3:
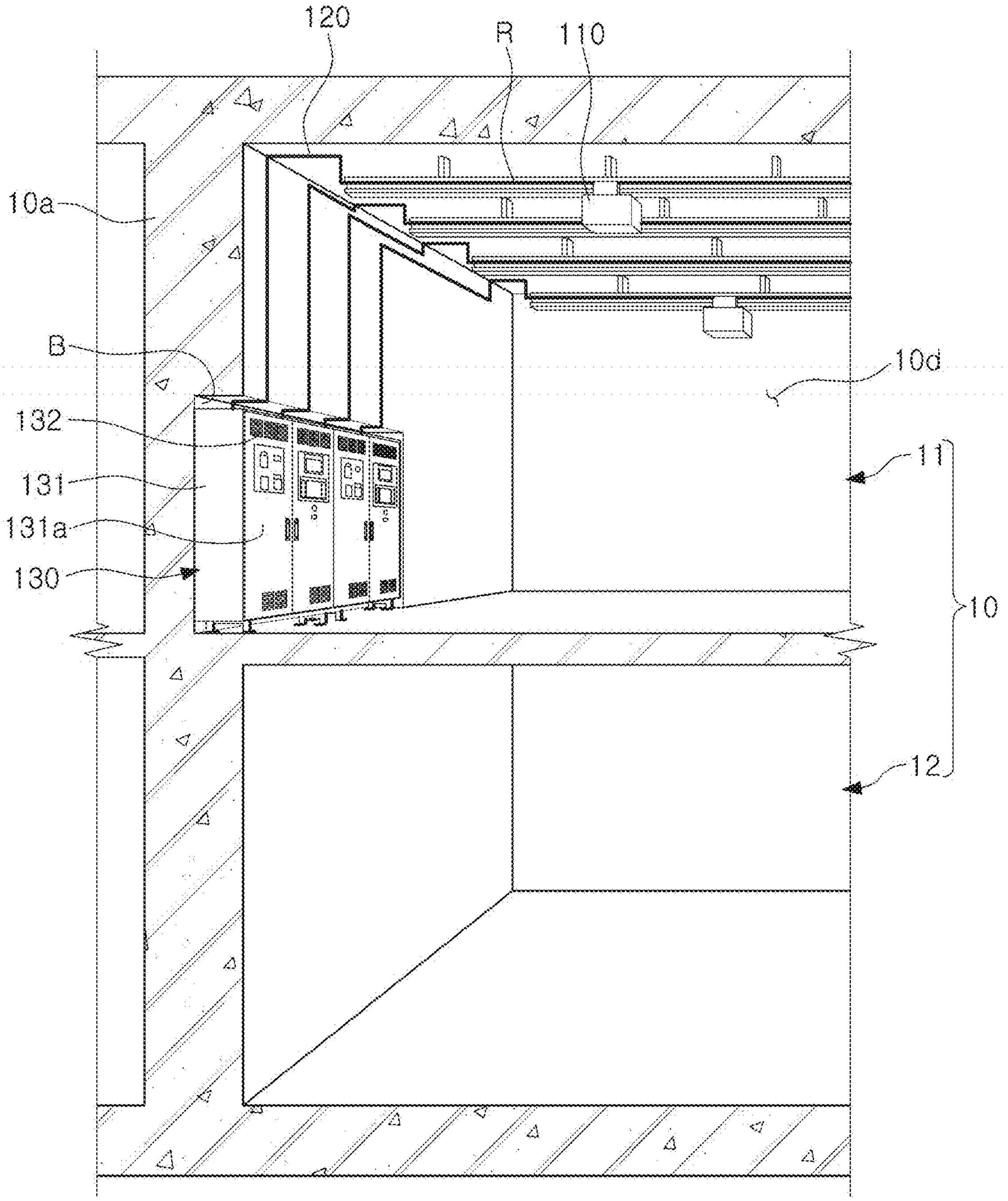
FIG. 3 is a view illustrating that a power supply panel according to the present disclosure is buried in a buried space of a first embodiment, formed in a wall of a main FAB.
Figure 4:
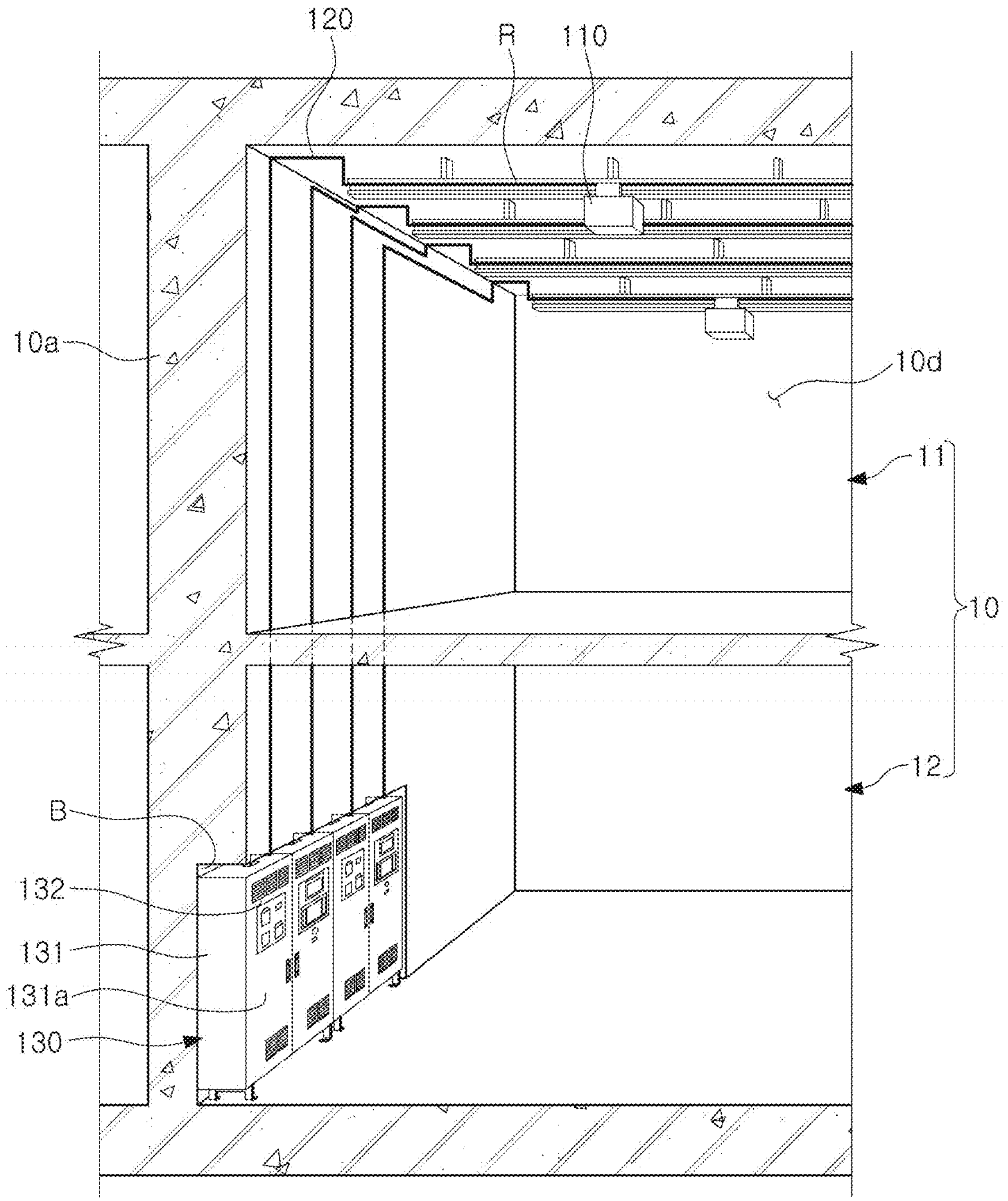
FIG. 4 is a view illustrating that a power supply panel according to the present disclosure is buried in a buried space of a second embodiment, formed in a wall of a sub-FAB.

FIG. 3 is a view illustrating that a power supply panel according to the present disclosure is buried in a buried space of a first embodiment, formed in a wall of a main FAB, and FIG. 4 is a view illustrating that a power supply panel according to the present disclosure is buried in a buried space of a second embodiment, formed in a wall of a sub-FAB.

Referring to the drawings, a facility 100 for transporting a substrate according to the present disclosure may include an OHT vehicle 110, an electric cable 120, and a power supply panel 130.

The OHT vehicle (a ceiling transport vehicle) 110 may move along a rail R installed on a ceiling in a FAB 10. Specifically, the OHT vehicle 110 may be installed on the rail R on the ceiling of a main FAB 11 in the FAB 10, to have a structure moving along the rail R. The electric cable 120 may be connected to the OHT vehicle 110, and may supply power applied from the power supply panel 130 to the OHT vehicle 110 in a non-contact manner.

The power supply panel 130 may include a power supply body 131 and a heat dissipation portion 132.

Figure 12:
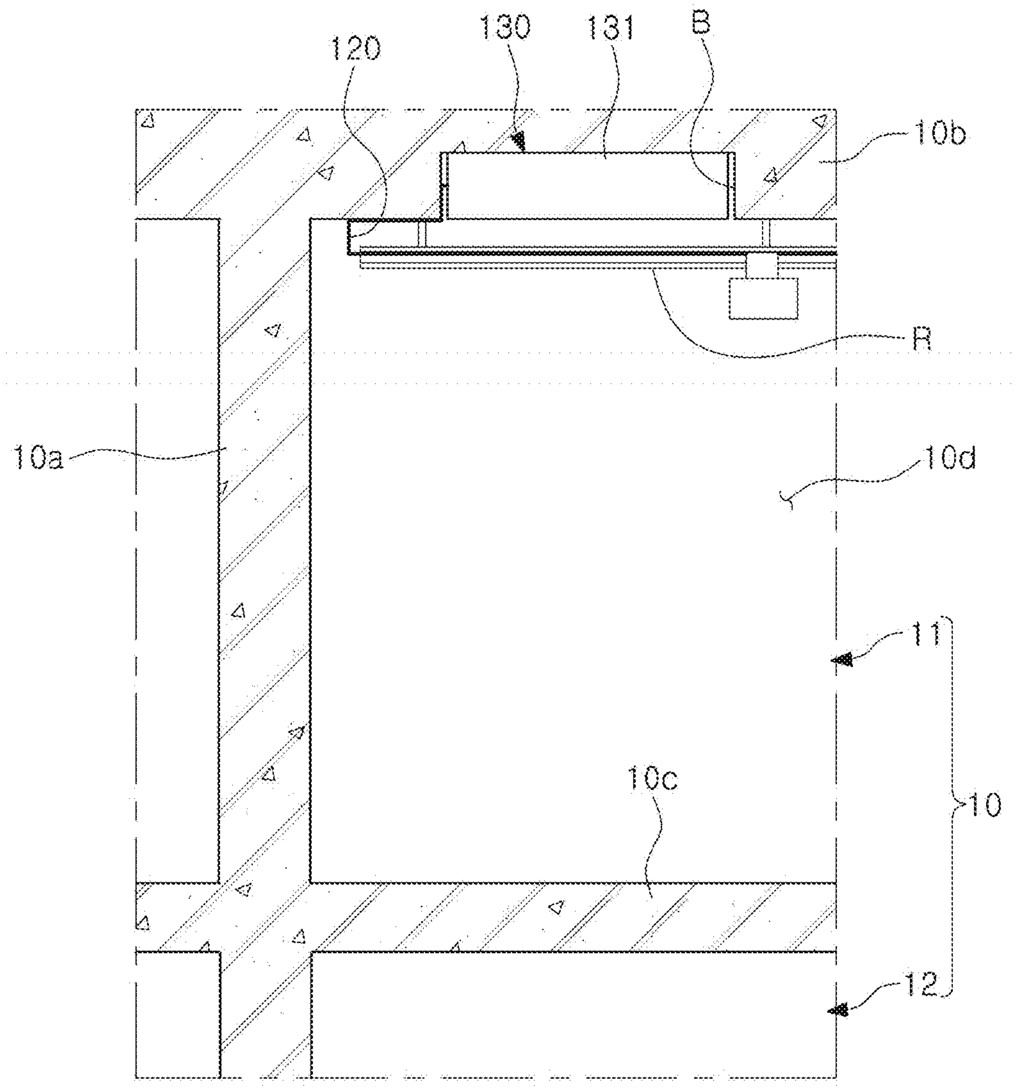
FIG. 12 is a view illustrating that a power supply panel according to the present disclosure is buried in a buried space of a fourth embodiment, formed in a ceiling of a main FAB.

First, the power supply body 131 may be configured to supply power to the OHT vehicle 110 through the electric cable 120 in a non-contact manner. The power supply body 131 may include electrically required components to supply the power. The power supply body 131 may be buried in a buried space B having a groove structure or a hole structure, formed in the FAB 10. In this case, the buried space B may be a component of a power supply structure of the present disclosure, together with the power supply panel 130. The buried space B may be formed to have a groove structure in a wall 10*a* of the main FAB 11, as illustrated in FIG. 3 in the FAB 10 as a specific example, and may be formed to a groove structure in a wall 10*a* of a sub-FAB 12, as illustrated in FIG. 4 as another example. The buried space B may be formed to a groove structure in a ceiling 10*b* of the FAB 10, as illustrated in FIG. 12 as another example. Further, the buried space B may be formed on a slab 10*c* (in FIG. 12) between the main FAB 11 and the sub-FAB 12, although not illustrated in the drawings. As such, the present disclosure may improve space utilization efficiency by taking a structure in which the power supply body 131 is buried in the buried space B in the FAB 10.

The FAB 10 may include a main FAB 11 and a sub-FAB 12 below the main FAB 11, wherein the buried space B may be formed in a wall 10*a* of the main FAB 11. In this manner, according to the present disclosure, the power supply body 131 may be buried in the buried space B formed in the wall 10*a* of the main FAB 11, not the sub-FAB 12. Therefore, as a length of the electric cable 120 leading to the rail R of the main FAB 11 is shortened and an arrangement structure of the electric cable 120 is also simplified, maintenance of the electric cable 120 may be simplified and easy.

When the power supply body 131 is inserted into and buried in the buried space B, a front portion 131*a* may be disposed to face an exposed surface of the buried space B. Therefore, a controller installed in the front portion 131*a* may be smoothly operated by an operator, and a display unit installed in the front portion 131*a* may be visually and smoothly confirmed by the operator.

In addition, the heat dissipation portion 132 of the present disclosure may be formed in the front portion 131*a* of the power supply body 131. For example, the heat dissipation portion 132 may be formed to face the exposed surface of the buried space B in the power supply body 131. Therefore, the heat dissipation portion 132 may be disposed to face the exposed surface of the buried space B, not a closed side of the buried space B. For example, the buried space B may be formed to be exposed to a semiconductor manufacturing space 10*d* of the FAB 10. In this case, the front portion 131*a* of the power supply body 131 in which the heat dissipation portion 132 is formed may be disposed to face the semiconductor manufacturing space 10*d*. The power supply body 131 may be buried in the buried space B to increase space utilization efficiency. In this case, in terms of space utilization efficiency, the power supply body 131 may be in close contact with an inner surface (a rear surface, upper and lower surfaces, and both side surfaces) of the buried space B. To smoothly dissipate heat from the power supply body 131 in such a buried structure, the heat dissipation portion 132 may be formed in the front portion 131*a* disposed on the exposed surface of the buried space B in the power supply body 131. Conventionally, as illustrated in FIG. 2, since the power supply panel 3 does not have a buried structure, intake of air may be performed through a rear surface and a lower surface, and exhaust of the air may be performed through a side surface. In the present disclosure, as illustrated in FIG. 5, the heat dissipation portion 132 may be formed in the front portion 131*a* disposed on the exposed surface of the buried space B in the power supply body 131, to dissipate smoothly heat, even though the power supply body 131 forms a buried arrangement structure.

Figure 5:
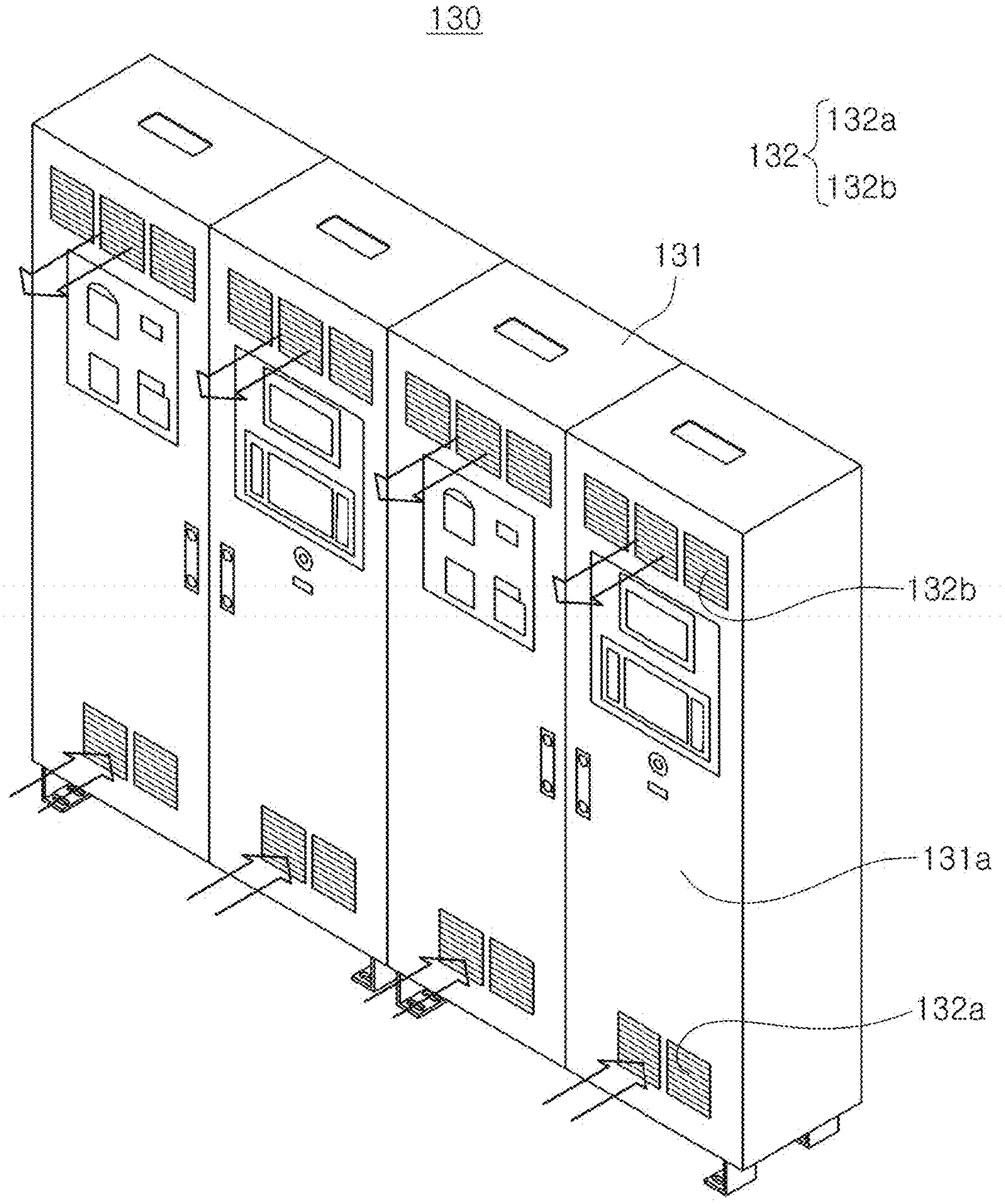
FIG. 5 is a view illustrating the power supply panel of FIG. 3.
Figure 6:
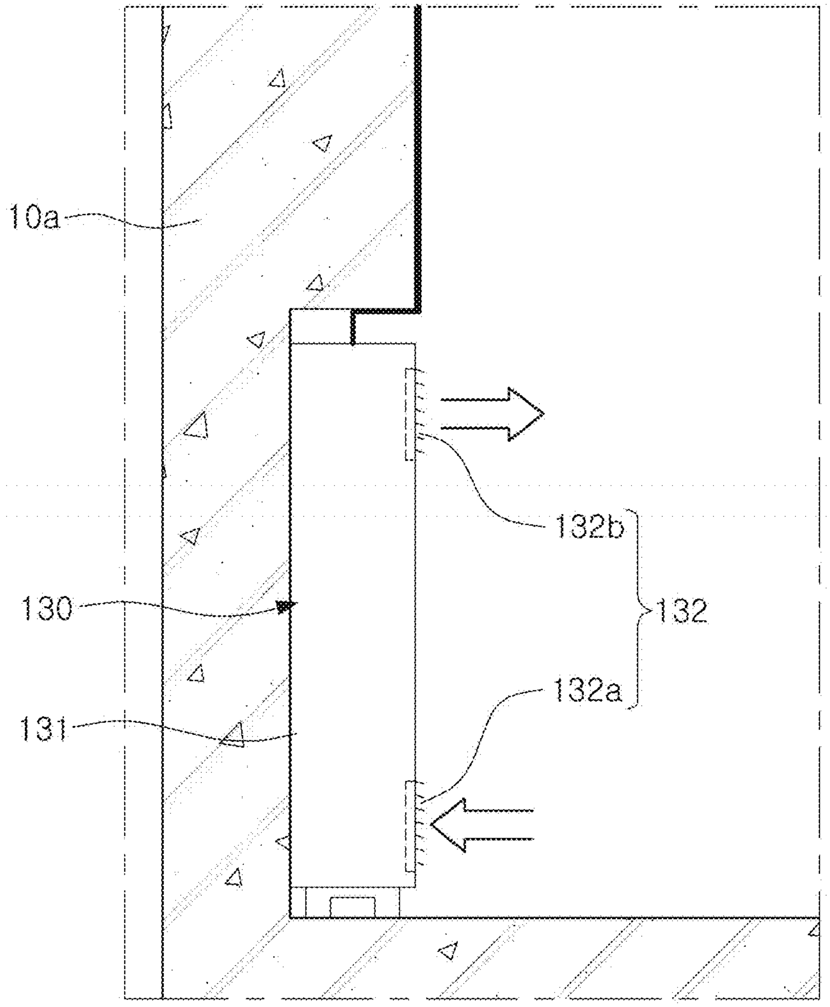
FIG. 6 is a view illustrating that air is suctioned and discharged through a heat dissipation portion in the power supply panel of FIG. 3.

FIG. 5 is a view illustrating the power supply panel of FIG. 3, and FIG. 6 is a view illustrating that air is suctioned and discharged through a heat dissipation portion in the power supply panel of FIG. 3.

Referring to the drawings, the heat dissipation portion 132 of the power supply panel 130 according to the present disclosure may include an inlet 132*a* and an outlet 132*b*. The inlet 132*a* may be a portion through which air is suctioned into the power supply body 131 by a heat dissipation fan installed in the power supply body 131. The outlet 132*b* may be a portion through which air is discharged from the power supply body 131 externally by the heat dissipation fan installed in the power supply body 131. In this case, the inlet 132*a* may be formed in a lower portion of the front portion 131*a* of the power supply body 131, and the outlet 132*b* may be formed in an upper portion of the front portion 131*a*. As described above, since the inlet 132*a* is disposed on a lower height level than the outlet 132*b*, air having a lower temperature may be suctioned to increase a heat dissipation effect.

Figure 7A:
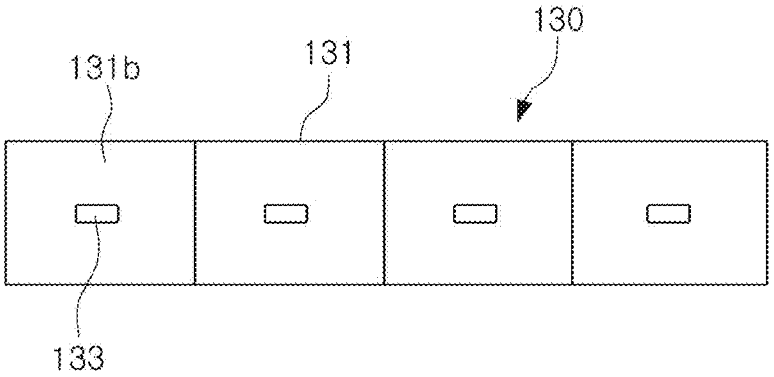
FIG. 7A is a view illustrating an upper surface portion of the power supply panel of FIG. 3.
Figure 7B:
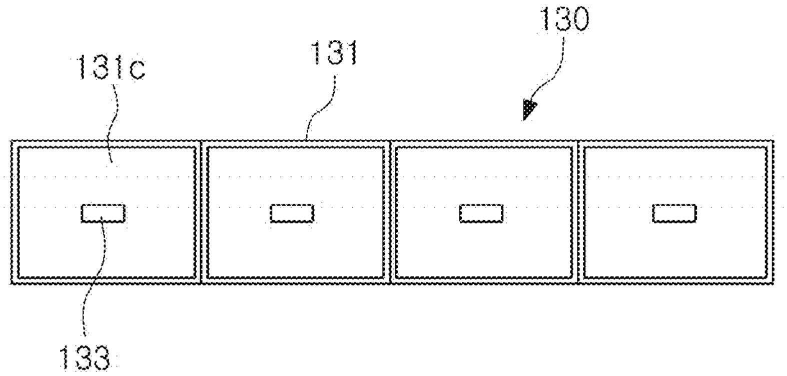
FIG. 7B is a view illustrating a lower surface portion of the power supply panel of FIG. 3.

FIG. 7A is a view illustrating an upper surface portion of the power supply panel of FIG. 3, and FIG. 7B is a view illustrating a lower surface portion of the power supply panel of FIG. 3.

Referring to FIGS. 3 and 7, the power supply panel 130 according to the present disclosure may further include a cable connection portion 133. The cable connection portion 133 may be formed on the power supply body 131, and the electric cable 120 to which power is applied may be connected to the cable connection portion 133. The cable connection portion 133 may be formed independently on an upper surface portion 131*b* and a lower surface portion 131*c* of the power supply body 131, respectively. As the power supply body 131 is configured to be buried in the buried space B, arrangement of the electric cable 120 may be affected by a shape of the buried space B and arrangement of peripheral facilities. Therefore, depending on the shape of the buried space B and the arrangement of the peripheral facilities, the cable connection portion 133 in the upper surface portion 131*b* of the power supply body 131 may be selected, or the cable connection portion 133 in the lower portion 131*c* of the power supply body 131 may be selected. For example, according to a layout of the buried space B and the peripheral facilities, the electric cable 120 may connect simply and effectively from the power supply body 131 to the OHT vehicle 110. One of the upper surface portion 131*b* of the power supply body 131 or the lower portion 131*c* of the power supply body 131 may be selected and utilized.

Figure 8A:
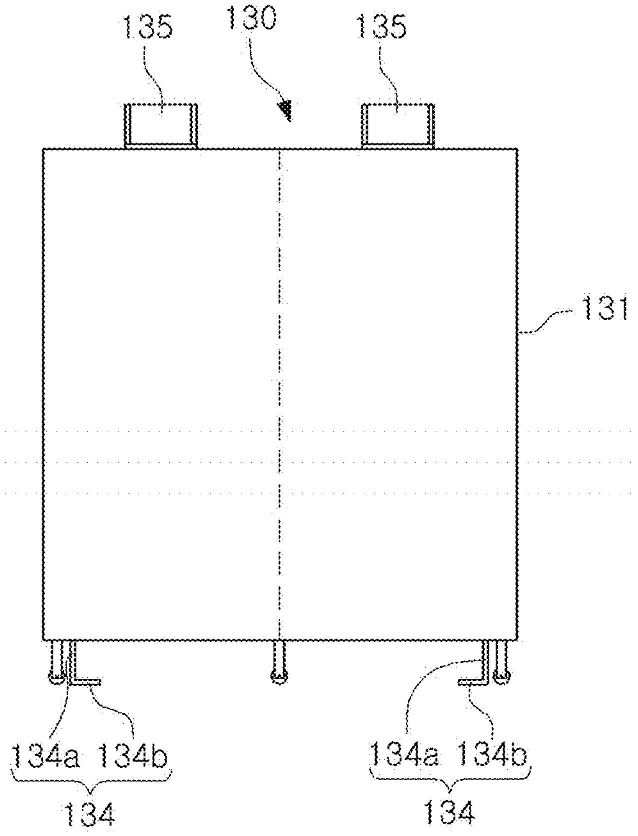
FIG. 8A and FIG. 8B are a front view and a side view illustrating that a main anchor and an upper anchor are installed in a power supply body of a power supply panel according to the present disclosure.
Figure 8B:
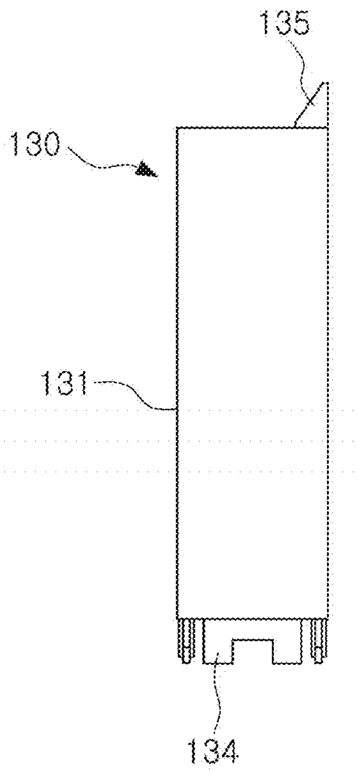

FIG. 8A and FIG. 8B are a front view and a side view illustrating that a main anchor and an upper anchor are installed in a power supply body of a power supply panel according to the present disclosure.

Referring to FIGS. 3 and 8, a power supply panel 130 according to the present disclosure may further include a main anchor 134. The main anchor 134 may fix a power supply body 131 on a bottom surface facing the power supply body 131 in a buried space B. Specifically, the main anchor 134 may include a connection portion 134*a* and a connection portion 134*b*. The connection portion 134*a* may be installed laterally on a lower surface of the power supply body 131, and may extend in a downward direction. The connection portion 134*b* may take a structure fixed while being supported on the bottom surface facing the power supply body 131. The connection portion 134*b* may extend from the connection portion 134*a* toward a center of the lower surface of the power supply body 131 not to protrude from the power supply body 131 in a lateral direction. Since the power supply body 131 is buried in the buried space B, the connection portion 134*b* may have the above-described structure not protruding from the power supply body 131 in the lateral direction. For example, since the power supply body 131 is in close contact with an inner surface (a rear surface, upper and lower surfaces, and both side surfaces) of the buried space B in terms of space utilization efficiency, the connection portion 134*b* may extend from the connection portion 134*a* toward the center of the lower surface of the power supply body 131.

In addition, the power supply panel 130 according to the present disclosure may further include an upper anchor 135. For example, as illustrated in FIG. 3 or 4, when there is a rear wall surface facing the power supply body 131 in the buried space B, the power supply body 131 may be fixed to the upper anchor 135, together with the main anchor 134. The upper anchor 135 may fix an upper portion of the power supply body 131 to the rear wall surface facing the power supply body 131 in the buried space B. Specifically, the upper anchor 135 may be rear installed on the upper surface of the power supply body, may extend in an upward direction, and may be supported by and fixed to the rear wall surface facing the power supply body 131. The upper anchor 135 may also have a non-protruding structure in the lateral direction of the power supply body 131, like the main anchor 134. As the upper anchor 135 serves to fix the power supply body 131, together with the main anchor 134, the power supply body 131 may be stably disposed.

Figure 9:
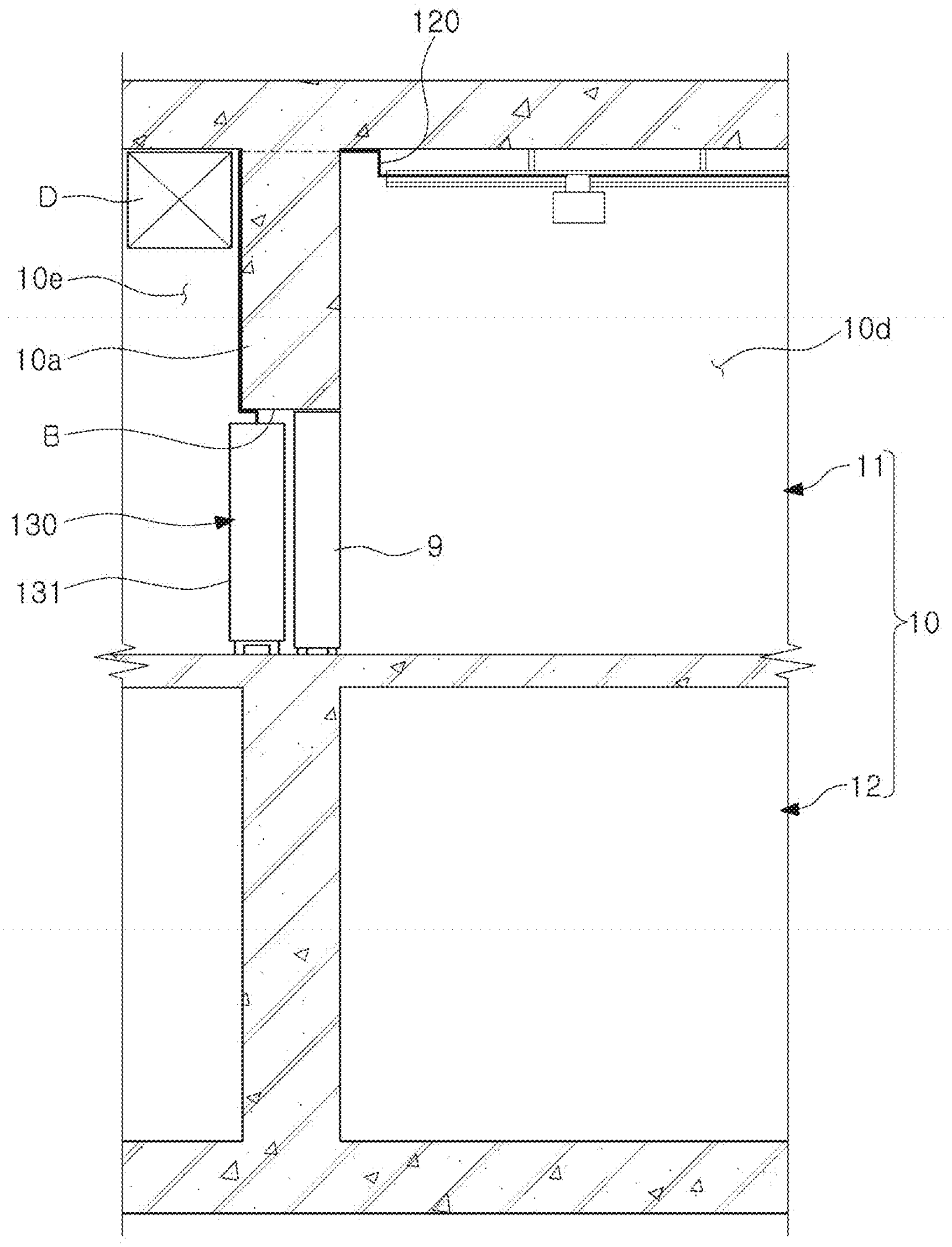
FIG. 9 is a view illustrating that a power supply panel according to the present disclosure is buried in a buried space of a third embodiment, formed in a wall of a main FAB.
Figure 10:
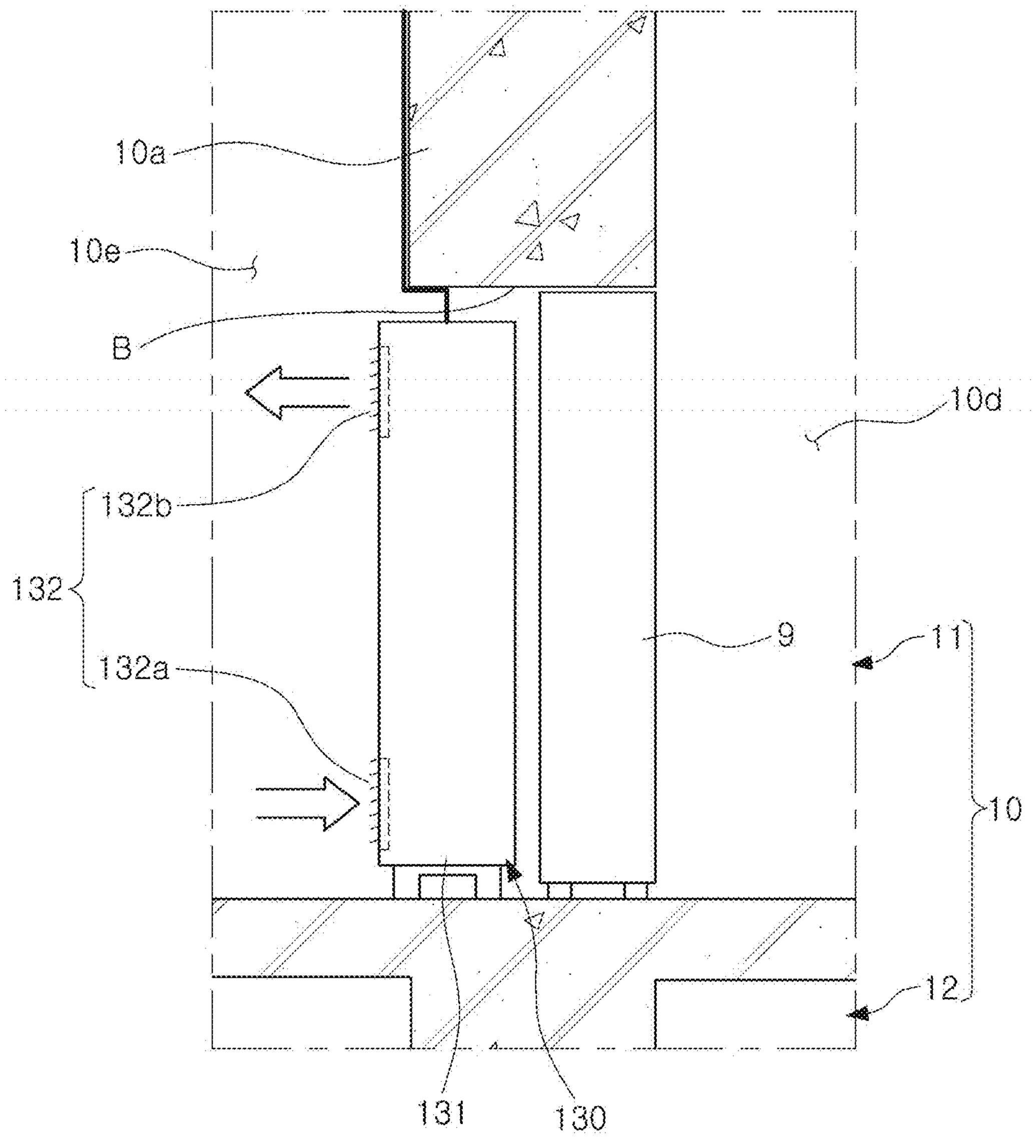
FIG. 10 is a view illustrating air is suctioned and discharged through a heat dissipation portion in the power supply panel of FIG. 9.

FIG. 9 is a view illustrating that a power supply panel according to the present disclosure is buried in a buried space of a third embodiment, formed in a wall of a main FAB, and FIG. 10 is a view illustrating air is suctioned and discharged through a heat dissipation portion in the power supply panel of FIG. 9.

Referring to the drawings, in a FAB 10, a duct chamber 10*e* in which an air duct D is disposed may be formed outside a wall 10*a*. In this case, a buried space B may be formed to be exposed to the duct chamber 10*e*. Furthermore, the buried space B may be formed to be exposed to both a semiconductor manufacturing space 10*d* and the duct chamber 10*e* in the FAB 10, as illustrated in the drawings. Specifically, a distribution board may be buried and disposed in one side portion of the buried space B (a portion facing the semiconductor manufacturing space 10*d*). In addition, a power supply panel 130 according to the present disclosure may be buried and disposed in the other side portion of the buried space B (a portion facing the duct chamber 10*e*). In this case, a front portion 131*a* of a power supply body 131 in which a heat dissipation portion 132 including an inlet 132*a* and an outlet 132*b* is formed may be disposed to face the duct chamber 10*e*. Also, an electric cable 120 may be disposed from the power supply body 131 to face the semiconductor manufacturing space 10*d* through the duct chamber 10*e*. Although not illustrated in the drawings, the electric cable 120 may be disposed in a main FAB 11 without passing through the duct chamber 10*e*.

Furthermore, the FAB 10 may be divided into a main FAB 11 and a sub-FAB 12, although not illustrated in the drawings, the duct chamber 10*e* may be disposed outside the sub-FAB 12. In this case, the semiconductor manufacturing space 10*d* may refer to an inner space of the sub-FAB 12.

In this manner, when the buried space B is formed to be exposed to the duct chamber 10*e*, and a distribution board 9 is buried together with the power supply panel 130, the power supply panel 130 may be buried and disposed in a portion of the buried space B facing the duct chamber 10*e*, to improve space utilization efficiency.

Figure 11A:
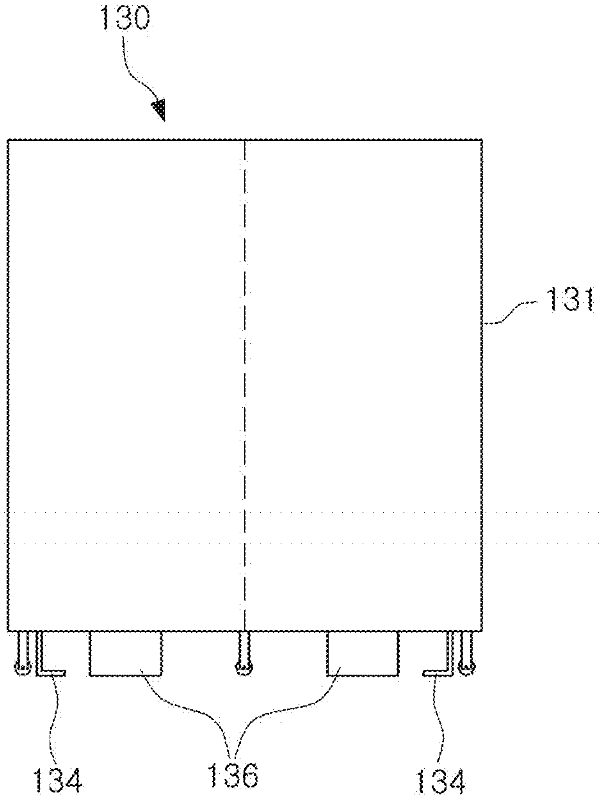
FIG. 11A and FIG. 11B are a front view and a side view illustrating that a main anchor and a rear anchor is installed in a power supply body of a power supply panel according to the present disclosure.
Figure 11B:
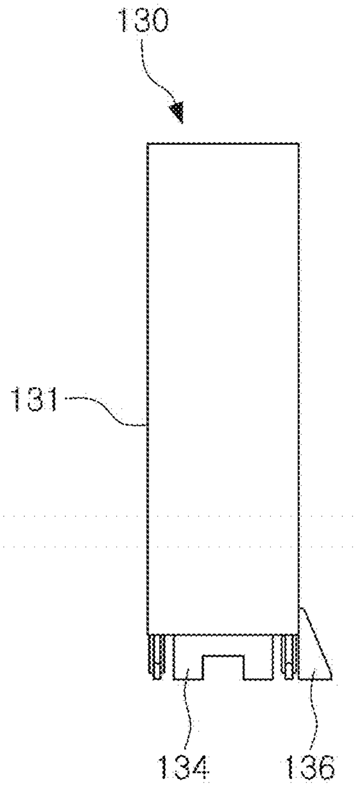

FIG. 11A and FIG. 11B are a front view and a side view illustrating that a main anchor and a rear anchor is installed in a power supply body of a power supply panel according to the present disclosure.

Referring to the drawings, a power supply panel 130 according to the present disclosure may further include a rear anchor 136. For example, as illustrated in FIGS. 9 and 10, when there is no wall surface facing a rear portion of a power supply body 131 in a buried space B, the power supply body 131 may be fixed using the rear anchor 136, together with a main anchor 134. The rear anchor 136 may fix the rear portion of the power supply body 131 to a portion of a bottom surface facing the rear portion of the power supply body 131 in the buried space B. Specifically, the rear anchor 136 may be installed on a lower portion of a rear surface of the power supply body 131, may extend in a downward direction, and may be supported by and fixed to the portion of the bottom surface facing the rear portion of the power supply body 131. The rear anchor 136 may not protrude from the power supply body 131 in a lateral direction, in a similar manner to the main anchor 134. As the rear anchor 136 serves to fix the power supply body 131 together with the main anchor 134, the power supply body 131 may be stably disposed.

FIG. 12 is a view illustrating that a power supply panel according to the present disclosure is buried in a buried space of a fourth embodiment, formed in a ceiling of a main FAB.

Referring to the drawings, a FAB 10 may include a main FAB 11 and a sub-FAB 12 below the main FAB 11. In this case, a buried space B may be formed in a ceiling 10*b* of the main FAB 11, rather than a wall 10*a* of the main FAB 11. Therefore, a power supply panel 130 according to the present disclosure may be buried in the buried space B formed in the ceiling 10*b* of the main FAB 11. In this manner, as the power supply panel 130 is buried in the ceiling 10*b* of the main FAB 11, an electrical cable 120 connected to a rail R from a power supply body 131 may take a simple arrangement with a short length. Therefore, maintenance may be simplified and facilitated.

Furthermore, although not illustrated in the drawings, the buried space B may be formed in a slab 10*c* between the main FAB 11 and a sub-FAB 12.

The present disclosure may improve space utilization efficiency by taking a structure in which a power supply body is buried in a buried space in a FAB.

In addition, in the present disclosure, as a buried space is formed in a wall of a main FAB to shorten a length of an electric cable leading to a rail of the main FAB and to simplify arrangement of the electric cable, maintenance of the electric cable may be simplified and facilitated.

In addition, according to the present disclosure, a heat dissipation portion may be formed in a front portion exposed to a buried space in a power supply body to smoothly dissipate heat, even though the power supply body has a buried arrangement.

And, in the present disclosure, as a cable connection portion is formed independently on an upper surface portion and a lower surface portion of a power supply body, respectively, such that one cable connection portion on one of the upper and lower surface portions of the power supply body is configured according to a configuration of a layout of a buried space and peripheral facilities. Due thereto, the present disclosure may simply and effectively connect the electric cable from the power supply body to an OHT vehicle.

Furthermore, according to the present disclosure, since a main anchor not protruding from a power supply body in a lateral direction may be configured to firmly and stably fix the power supply body even in a buried structure.

While example embodiments have been illustrated and described above, it will be apparent to those skilled in the art that modifications and variations could be made without departing from the scope of the present disclosure as defined by the appended claims.

What is claimed is:

1. A power supply structure comprising:

a buried space having a groove structure or a hole structure, formed in a fabrication facility (FAB);

a power supply body buried in the buried space such that a front portion is disposed on an exposed surface of the buried space, and supplying power; and a heat dissipation portion formed on the front side of the power supply body, wherein, in the FAB, a duct chamber in which an air duct is disposed is formed outside a wall of the FAB, and wherein the buried space is formed to be exposed to the duct chamber or to both the semiconductor manufacturing space and the duct chamber in the FAB.

2. The power supply structure of claim 1, wherein the heat dissipation portion comprises an inlet through which air is suctioned into the power supply body by a heat dissipation fan installed in the power supply body, and an outlet through which air is discharged from the power supply body externally by the heat dissipation fan, wherein the inlet is formed in a lower portion of the front portion, and the outlet is formed in an upper portion of the front portion.

3. The power supply structure of claim 1, further comprising a cable connection portion formed on the power supply body and to which an electric cable to which the power is applied is connected, wherein the cable connection portion is formed independently on an upper surface portion and a lower surface portion of the power supply body, respectively.

4. The power supply structure of claim 1, wherein the buried space is formed in the wall of the FAB to be exposed to the semiconductor manufacturing space of the FAB.

5. The power supply structure of claim 1, wherein the FAB comprises a main FAB and a sub-FAB below the main FAB, wherein the buried space is formed in the wall of the main FAB.

6. The power supply structure of claim 1, wherein the FAB comprises a main FAB and a sub-FAB below the main FAB, wherein the buried space is formed in a ceiling of the main FAB or in a slab between the main FAB and the sub-FAB.

7. The power supply structure of claim 1, further comprising a main anchor fixing the power supply body to a bottom surface facing the power supply body in the buried space, wherein the main anchor includes:

a connection portion installed laterally on a lower surface of the power supply body and extending in a downward direction; and a fixing portion extending from the connection portion toward a center of the lower surface of the power supply body so as not to protrude from the power supply body in a lateral direction, and supported by and fixed to the bottom surface facing the power supply body.

8. The power supply structure of claim 7, further comprising an upper anchor fixing an upper portion of the power supply body to a rear wall surface facing the power supply body in the buried space, wherein the upper anchor is rear installed on the upper surface of the power supply body, extends in an upward direction, and is supported by and fixed to the rear wall surface facing the power supply body.

9. The power supply structure of claim 7, further comprising a rear anchor fixing a rear portion of the power supply body to a portion of the bottom surface facing the rear portion of the power supply body in the buried space, wherein the rear anchor is installed on a lower portion of a rear surface of the power supply body, extends in a downward direction, and is supported by and fixed to the portion of the bottom surface facing the rear portion of the power supply body.

10. A facility for transporting a substrate, comprising:

an overhead hoist transport (OHT) vehicle moving along a rail installed on a ceiling in a fabrication facility (FAB);

an electric cable installed on the rail;

a power supply body buried in a buried space having a groove structure or a hole structure, formed in a wall of the FAB, such that a front portion is disposed on an exposed surface of the buried space, and the electric cable is connected to the OHT vehicle and supplies power to the OHT vehicle through the electric cable; and a heat dissipation portion formed in the front portion of the power supply body, to be exposed in a direction, other than a direction facing the buried space, wherein the FAB comprises a main FAB and a sub-FAB below the main FAB, and wherein the power supply body is buried in a wall of the main FAB.

11. The facility of claim 10, wherein the heat dissipation portion comprises an inlet through which air is suctioned into the power supply body by a heat dissipation fan installed in the power supply body, and an outlet through which air is discharged from the power supply body externally by the heat dissipation fan, wherein the inlet is formed in a lower portion of the front portion, and the outlet is formed in an upper portion of the front portion.

12. The facility of claim 10, further comprising a cable connection portion formed on the power supply body and to which the electric cable is connected, wherein the cable connection portion is formed independently on an upper surface portion and a lower surface portion of the power supply body, respectively.

13. The facility of claim 10, wherein the buried space is formed to face an exposed surface of a semiconductor manufacturing space in the FAB, and the front portion of the power supply body in which the heat dissipation portion is formed is disposed to face the semiconductor manufacturing space.

14. The facility of claim 10, wherein the FAB has a duct chamber in which an air duct is disposed outside the wall, and the buried space is formed to be exposed to the duct chamber or to both a semiconductor manufacturing space and the duct chamber in the FAB, wherein the front portion of the power supply body in which the heat dissipation portion is formed is disposed to face the duct chamber, and the electric cable is disposed from the power supply body to face the semiconductor manufacturing space through the duct chamber.

15. A facility for transporting a substrate, comprising:

an overhead hoist transport (OHT) vehicle moving along a rail installed on a ceiling in a fabrication facility (FAB);

an electric cable installed on the rail;

a power supply body buried in a buried space having a groove structure or a hole structure, formed in a wall of the FAB, such that a front portion is disposed on an exposed surface of the buried space, and the electric cable is connected to the OHT vehicle and supplies power to the OHT vehicle through the electric cable; and a heat dissipation portion formed in the front portion of the power supply body, to be exposed in a direction, other than a direction facing the buried space, wherein the FAB comprises a main FAB and a sub-FAB below the main FAB, and wherein the buried space is formed in a ceiling of the main FAB or in a slab between the main FAB and the sub-FAB.

* * * * *